United States Patent
Wu et al.

(10) Patent No.: US 8,842,029 B2
(45) Date of Patent: Sep. 23, 2014

(54) AREA-EFFICIENCY DELTA MODULATOR FOR QUANTIZING AN ANALOG SIGNAL

(71) Applicant: National Chiao Tung University, Hsinchu (TW)

(72) Inventors: Chun-Yu Wu, Hsinchu (TW); Yuan-Fu Lyu, Taoyuan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/788,518

(22) Filed: Mar. 7, 2013

(65) Prior Publication Data

US 2014/0077982 A1    Mar. 20, 2014

(30) Foreign Application Priority Data

Sep. 19, 2012  (TW) .............................. 101134223 A

(51) Int. Cl.
*H03M 3/00* (2006.01)
*H03M 3/02* (2006.01)

(52) U.S. Cl.
CPC ................ *H03M 3/02* (2013.01); *H03M 3/022* (2013.01)
USPC ............................ 341/143; 341/155; 341/144

(58) Field of Classification Search
USPC .................. 341/155, 143, 144, 172, 120, 156
See application file for complete search history.

(56) References Cited

U.S. PATENT DOCUMENTS

| | | | |
|---|---|---|---|
| 5,926,123 A * | 7/1999 | Ostrom et al. | 341/120 |
| 7,570,185 B2 * | 8/2009 | Rao et al. | 341/138 |
| 7,656,330 B2 * | 2/2010 | O'Dowd et al. | 341/143 |
| 8,009,072 B2 * | 8/2011 | Rigby et al. | 341/143 |

OTHER PUBLICATIONS

Wei-Ming Chen et al., "A Fully Integrated 8-Channel Closed-Loop Neural-Prosthetic SoC for Real-Time Epileptic Seizure Control." ISSCC 2013 / Session 16 / Biomedical Circuits & Systems / 16.1. 2013 IEEE International Solid-State Circuits Conference. 978-1-4673-4516-3/13, p. 286.

* cited by examiner

*Primary Examiner* — Peguy Jean Pierre
(74) *Attorney, Agent, or Firm* — Bacon & Thomas, PLLC

(57) ABSTRACT

The invention comprises sample-and-hold circuit and digital-to-analog converter into a differentially operational unit. In analog-to-digital conversion unit, on the premise of fixed or non-fixed quantization error, analog-to-digital converter dynamically adjusts number of bits solved or size of quantized step according to the magnitude of differential voltage between sampled input signal and previously quantized input signal, thus this invention can reduce the non-necessary power consumption from redundant code and overload of input signal. Differentially operational unit and analog-to-digital unit share the same capacitor array which has binary-weighted arrangement to reduce circuit complexity and area.

2 Claims, 4 Drawing Sheets

AREA-EFFICIENCY DELTA MODULATOR FOR QUANTIZING AN ANALOG SIGNAL

BACKGROUND OF THE INVENTION

1. Field of the Invention

The invention relates to a delta modulator, and particularly to a delta modulator which can dynamically adjust number of bits solved or quantization step size to accomplish the function of differential sample and analog-to-digital conversion.

2. Description of the Prior Art

The conventional sample-and-hold circuit and the feedback integrator also referred to as digital-to-analog converter are the independent circuits respectively, and each circuit is connected to positive/negative input terminal of the comparator. In the design, the offset of comparator shall keep fixed under different common-mode voltage. The feedback integrator or the digital-to-analog converter adopts current/voltage integration mode, which is apt to be influenced by the jitter of clock, and the distortion of output signal will be occurred. The current sources and voltage sources shall be matched perfectly to avoid the output voltage drift of integrator. The feedback integrator or the digital-to-analog converter alters the charge-discharge frequency to dynamically adjust quantization step size, but an additional clock source higher than the sampling frequency is required.

Please refer to the prior art shown in FIG. 1A, and refer to U.S. Pat. No. 3,761,841, two input terminals of the comparator 23 are respectively connected with the input signal and the output of the integrator composed of the resistor R1 and the capacitor C1. The feedback trigger 19 takes the sample from the output of the comparator 23 at fixed frequency. The current source S1 (current: 2I) and current source S2 (current: I) are used to increase or decrease a step size.

Please refer to the prior art shown in FIG. 1B, which exhibits normal output of the integrator composed of the resistor R1 and the capacitor C1. In the unused channel, the output voltage of the integrator composed of the resistor R1 and the capacitor C1 will be drifted, as the prior art shown in FIG. 1C, the ratio of current source S1 (current: 2I) and current source S2 (current: I) is not 2 to 1 due to the mismatch reason. The feedback trigger 17 dynamically adjusts the magnitude of current source S2 through the output of the integrator composed of the resistor R2 and the capacitor C2. The sampling frequency of the feedback trigger 17 equals to that of the feedback trigger 19, but there is a fixed phase difference. In order to prevent the mismatch of current source S1 and current source S2 and the integration time constant constituted by resistor R2 and capacitor C2 will be greater than the sampling period.

The structure shown in FIG. 1A adopts successive time to rebuild the signal (composed of S1, S2, R1, R2, C1, C2), which is apt to be influenced by the clock jitter, the integration time error will be generated. Under different common-mode voltage, the offset of the comparator won't be constant. If the input signal frequency is low, the integration constant needed by the integrator shall be high, so that large capacitor or large resistor (R1, C1, R2, C2) will be required. When the channel is unused, because the ratio of current source S1 (current: 2I) and current source S2 (current: I) is not 2 to 1, the output of the integrator composed of the resistor R1 and the capacitor C1 will be drifted, then a calibration circuit (composed of trigger 17, resistor R2, capacitor C2) will be required.

Please refer to the ordinary skill in the prior art shown in FIG. 2, and refer to U.S. Pat. No. 3,706,944, two terminals of the comparator 19 are respectively connected with the input signal Ein and the output of the integrator 28. The sampling pulse generator 21 takes the sample from the output of the flip flop 20. If the value of output signal E20 is logic '0', the logic gate 22 will output a negatively quantized step. If the value of the digital output signal E20 is logic '1', the logic gate 22 will output a positively quantized step. The digital output signal E20 judges whether the quantization step size is needed to be adjusted through the adaption logic 24. The output signal of the adaption logic 24 controls the output of the counter 25, and further controls the output frequency E26 of the pulse rate selector 26. The frequency ratio of E25 to E21 is used as the adjustment factor. The input signal E28 is rebuilt by repeatedly accumulating the unit step size, particularly the number of repetitions is decided according to the value of the adjustment factor. Redistribution ratio of $C_-$ to $(C_-+C_f)$ multiplied by the output voltage of logic gate 22 or 23 is defined as the unit step size.

Please refer to FIG. 2. The above-mentioned structure needs a high-frequency clock 27 to produce different frequency output ratio. The offset of the comparator 19 won't keep fixed under different common voltage.

Therefore, in order to produce more efficient delta-modulated device to provide better operation efficiency and lower manufacturing cost, it is necessary to develop a delta-modulated device for applying in voice, image, biomedical signal, and radio sensing etc. The purpose is to compress data and save power consumption for an analog-to-digital converter.

SUMMARY OF THE INVENTION

The main purpose of the invention is to provide a delta modulator, which comprises sample-and-hold circuit and digital-to-analog converter into a differentially operational unit. In analog-to-digital conversion unit, on the premise of fixed or non-fixed quantization error, analog-to-digital converter dynamically adjusts number of bits solved or quantization step size according to the magnitude of differential voltage between sampled input signal and previously quantized input signal, thus this invention can reduce the non-necessary power consumption from redundant code and simultaneously avoid overload of input signal. Differentially operational unit and analog-to-digital unit share the same capacitor array which has binary-weighted arrangement to reduce circuit complexity and area. This technique doesn't need to consume any static power to accomplish the function of differential sample and analog-to-digital conversion.

In order to achieve the above-mentioned purpose, the invention provides a delta modulator to receive an analog signal for carrying out delta operation and analog-to-digital conversion. The delta modulator includes a delta operator, a first analog-to-digital converter, a second analog-to-digital converter, a memory unit and a digital adder. The delta operator is used to subtract the previously solved code from the analog input signal to produce a differential signal. The first analog-to-digital converter is used to find the range of the differential signal. The second analog-to-digital converter is used to dynamically adjust the quantization step size for quantizing the differential signal based on the result of the first analog-to-digital converter. The digital adder is used to add an output binary code of the memory unit and a digital output code. The output binary code of the digital adder is stored in the memory unit.

A purpose of the invention is to provide a differentially operational unit, which adopts the passive elements and combines sample-and-hold circuit and feedback integration circuit or digital-to-analog converter in a same circuit to reduce the performance requirement and power consumption of the comparator.

Another purpose of the invention is to dynamically adjust the quantization step size through the binary-weighted capacitor array.

Another purpose of the invention is to adopt the asynchronous clock generator to detect the output of the comparator to generate multiple phases to control internal circuit.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Though the invention can be shown as different form of embodiments, the attached Figures and following detail description only reveal the preferred embodiments of the invention. It is understood that the features and/or the technical contents of the embodiment are not used to limit the present invention.

Figure 1A:
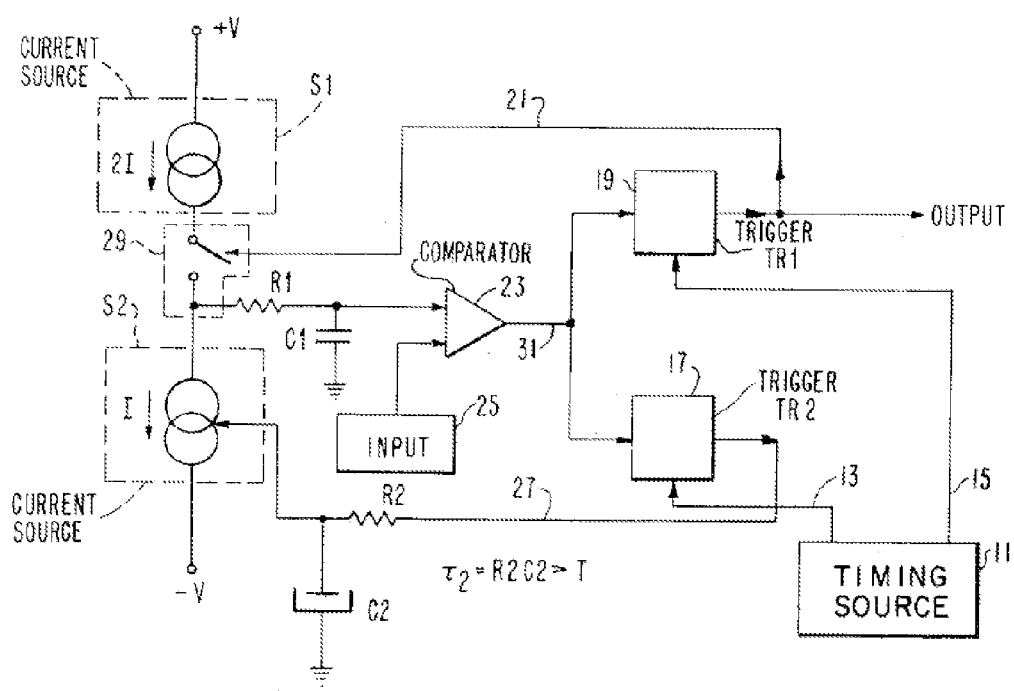
FIG. 1A is a schematic view of showing a delta modulator in the prior art.
Figure 1B:
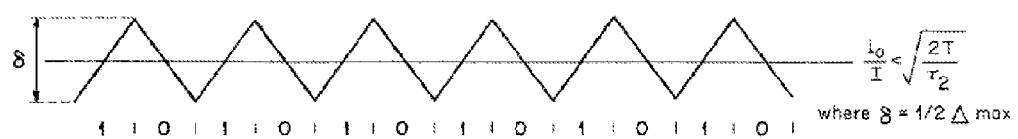
FIG. 1B is a schematic view of showing the normal output of an integrator in the prior art.
Figure 1C:
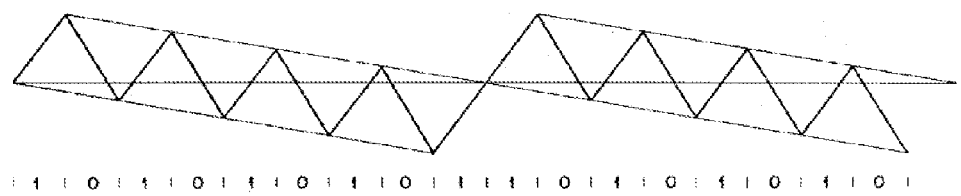
FIG. 1C is a schematic view of showing the drift output of an integrator in the prior art.
Figure 2:
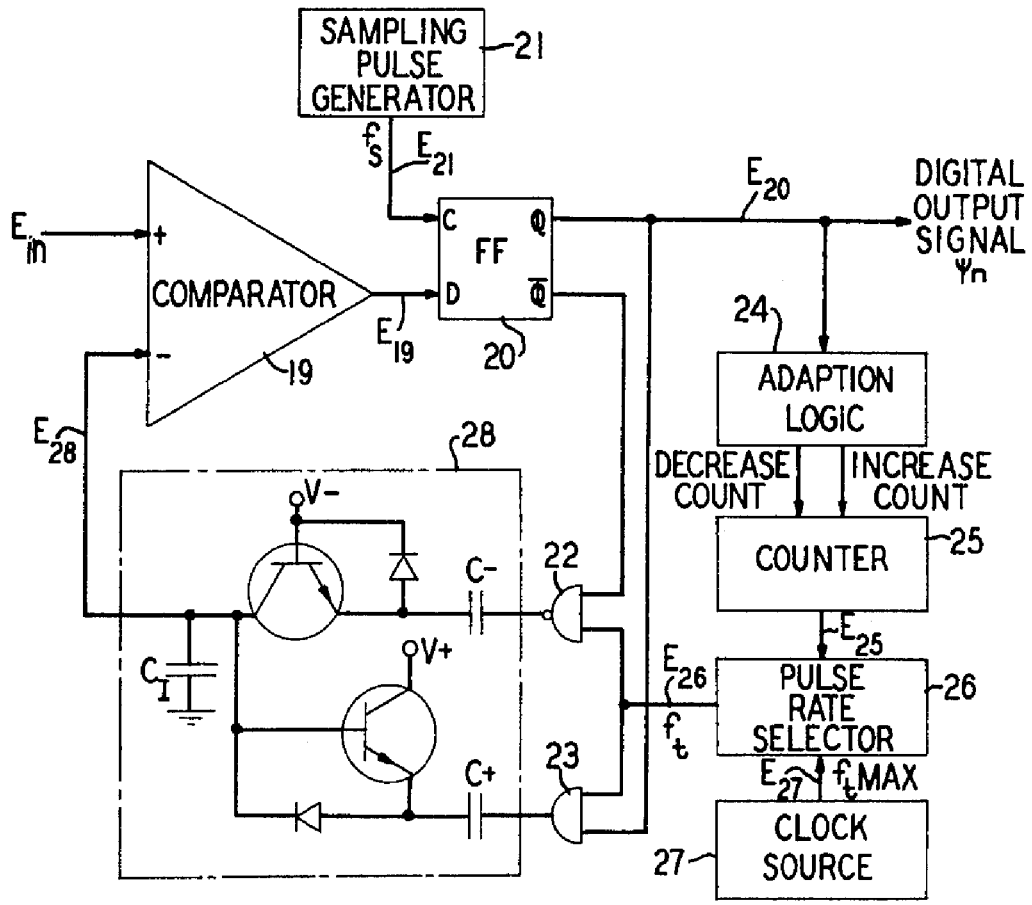
FIG. 2 is a schematic view of showing the internal structure of a delta modulator in the prior art.
Figure 3:
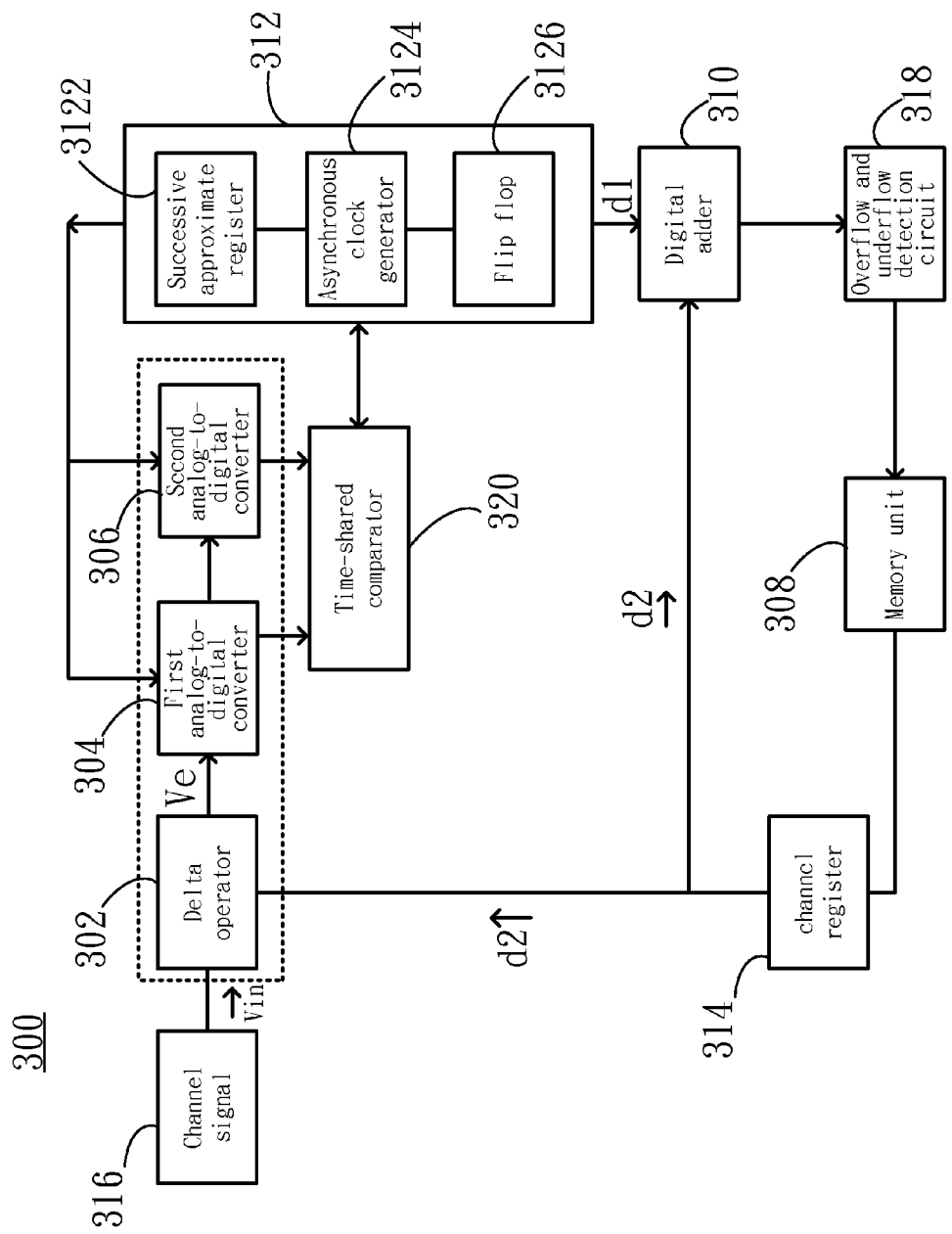
FIG. 3 is a schematic view of showing a stepping type analog-to-digital converter (delta modulator) in accordance of an embodiment of the invention.

Please refer to FIG. 3, which shows a stepping type analog-to-digital converter (delta modulator) in accordance of an embodiment of the invention. As shown in the FIG. 3, the stepping type analog-to-digital converter 300 includes a delta operator 302, a first analog-to-digital converter 304, a second analog-to-digital converter 306, a memory unit 308, a digital adder 310, a timing controller 312 and a register 314. The first analog-to-digital converter 304 is used to find the range of the differential signal. The second analog-to-digital converter 306 is used to dynamically adjust the quantization step size for quantizing the differential signal based on the result of the first analog-to-digital converter 304. The function for digital adder 310 is used to add an output binary code dl of the memory unit 308 and a digital output code d2. The output addition result of the digital adder 310 is stored in the memory unit 308. The second analog-to-digital converter 306 is used to dynamically adjust the quantization step size for quantizing the differential signal based on the result of the first analog-to-digital converter 304.

FIG. 3 shows the first analog-to-digital converter 304 of the invention. It is a coarse analog-to-digital converter (Coarse ADC), which is used to estimate the range of the differential signal and set several ranges. Under fixed or non-fixed quantization error, the range of sampling signal difference is estimated, in order to prevent the overload of differential signal.

FIG. 3 shows the second analog-to-digital converter 306 of the invention. It is a fine analog-to-digital converter (Fine ADC), which uses binary search method to solve the differential voltage until minimum bit or minimum unit defined by the user.

FIG. 3 shows analog input signal Vin is subtracted from the digital output code d2 through the delta operator 302. The first analog-to-digital converter 304 finds out the range of the differential signal Ve. The second analog-to-digital converter 306 quantizes the differential signal Ve to minimum bit based on the result of the first analog-to-digital converter 304. The digital adder 310 adds N-bit digital output code d2 outputted by the memory unit 308 and quantized output bit code d1. The digital adder 310 outputs its addition result and stores it into the memory unit 308.

As shown in FIG. 3, inputs an analog channel signal corresponding to channel register 314 coming from choice of channel memory unit 308, and two signals from the multiplexer 316 are taken through the delta operator 302 to obtain the differential signal. It means that a delta operation is executed for the channel signal 316 and the corresponding memory unit 308 signal to obtain the differential signal.

As shown in FIG. 3, the first analog-to-digital converter estimates the range of the differential signal and set several ranges. Under fixed or non-fixed quantization error, prevent the overload of signal difference, and reduce the non-necessary power consumption. It has to describe that the fine analog-to-digital converter (Fine ADC) uses binary search method to solve the differential voltage until minimum bit or minimum unit defined by the user. After the digital code obtained adds to the digital code outputted by the register 314 through the digital adder 310, overflow and underflow are judged by the overflow and underflow detection circuit 318, and then stored into the corresponding channel memory unit 308.

As shown in FIG. 3, the first analog-to-digital converter 304 (i.e. coarse analog-to-digital converter (Coarse ADC)) and the second analog-to-digital converter 306 (i.e. fine analog-to-digital converter (Fine ADC)) use the same time-shared comparator 320 for the comparison operation, which is not shown in the FIG. 3. The output of the time-shared comparator 320 is connected to the timing controller 312 including the successive approximation register (SAR) 3122, the asynchronous clock generator 3124 and flip flop (FF) 3126.

As shown in FIG. 3, the asynchronous clock generator 3124 generates several sets of phase clock to control the successive approximate register (SAR) 3122, and then switch the binary-weighted capacitor array to generate several sets of comparison voltage (not shown in the FIG. 3). The asynchronous clock generator 3124 detects the comparator output to generate the half-stable duration through the pulse detector, which is used as the reset time of the time-shared comparator 320 and the settling time required for switching the binary-weighted capacitor array.

It is understood that various other modifications will be apparent and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A delta modulator for receiving an analog signal, comprising:

a delta operator means for producing a differential signal;

a course analog-to-digital converter means for finding a range of said differential signal, said course analog-to-digital converter being used to estimate said range of said differential signal and set several ranges, under fixed or non-fixed quantization step size, a range of a sampling signal difference being estimated in order to prevent an overload of said differential signal;

a fine analog-to-digital converter means for dynamically adjusting a size of quantized step, said fine analog-to-digital converter using a binary search method to solve a differential voltage until a minimum bit or a minimum unit defined by a user;

a time-shared comparator;

a memory unit;

a timing controller, comprising a successive approximation register, an asynchronous clock generator means for detecting a comparator output to generate a half-stable duration wherein said asynchronous clock generator generates several sets of phase clock to control said successive approximate register, and a flip-flop;

a channel register;

a channel signal;

an overflow and underflow detection circuit; and a digital adder means for adding an output binary code of the memory unit and a digital output code;

wherein, an output addition result of said digital adder is stored into said memory unit, and said second analog-to-digital converter being used to dynamically adjust said quantization step size for quantizing said differential signal based on a result of said first analog-to-digital converter.

2. The delta modulator according to claim 1, wherein in a different time uses binary-weighted capacitor array to combine delta operator (DAC), coarse ADC, and fine ADC into one function block.

* * * * *